United States Patent
Hirano (10) Patent No.: US 6,519,024 B2
(45) Date of Patent: Feb. 11, 2003

(54) EXPOSURE APPARATUS AND DEVICE MANUFACTURING APPARATUS AND METHOD

(75) Inventor: Shinichi Hirano, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/813,168

(22) Filed: Mar. 21, 2001

(65) Prior Publication Data

US 2001/0046041 A1 Nov. 29, 2001

(30) Foreign Application Priority Data

Mar. 24, 2000 (JP) ........................................ 2000-084430

(51) Int. Cl.$^7$ ..................... G03B 27/52; G03B 27/42; G01B 11/00
(52) U.S. Cl. ........................ 355/55; 355/53; 356/401
(58) Field of Search .................... 355/30, 53, 55, 355/67–71, 77; 356/399–401; 250/201–205, 548

(56) References Cited

U.S. PATENT DOCUMENTS 4,668,077 A * 5/1987 Tanaka ........................ 355/30
4,701,606 A * 10/1987 Tanimoto et al. ............ 250/201
4,801,977 A * 1/1989 Ishizaka et al. .............. 355/30

* cited by examiner

Primary Examiner—Henry Hung Nguyen
(74) Attorney, Agent, or Firm—Fitzpatrick, Cella, Harper & Scinto

(57) ABSTRACT

An exposure apparatus includes a projection optical system for projecting a pattern onto a substrate, a detector for detecting information relating to at least one of a plurality of optical characteristics of the projection optical system, a storage unit for storing information regarding a relationship between the at least one of the optical characteristics and at least another one of the optical characteristics and an extraction unit for extracting control data for the at least another one of the optical characteristics on the basis of information detected by the detector and storage information stored by the storage unit.

8 Claims, 6 Drawing Sheets

| ILLUMINATION MODE N | | INTEGRATED EXPOSURE AMOUNT T | | | |
|---|---|---|---|---|---|
| | | A1>T | A2>DF>=A1 | A3>DF>=A2 | T>=A3 |
| DIFFERENCE FOCUS CORRECTION AMOUNT | B2>DF=B1 | C11 | C12 | C13 | C14 |
| | B3>DF>=B2 | C21 | C22 | C23 | C24 |
| | B4>DF>=B3 | C31 | C32 | C33 | C34 |
| | B5>DF>=B4 | C41 | C42 | C43 | C44 |
| | B6>DF>=B5 | C51 | C52 | C53 | C54 |
| | B7>DF>=B6 | C61 | C62 | C63 | C64 |

FIG. 5

FLOW OF MANUFACTURE OF SEMICONDUCTOR DEVICE

FIG. 6

EXPOSURE APPARATUS AND DEVICE MANUFACTURING APPARATUS AND METHOD

FIELD OF THE INVENTION

The present invention relates to a device manufacturing apparatus used in the manufacture of microdevices, e.g., a semiconductor chip such as an IC or LSI, a liquid crystal panel, a CCD, a thin film magnetic head, and a micromachine, and more particularly, to a correcting method of correcting a change in optical characteristics of a projection optical system in the device manufacturing apparatus.

BACKGROUND OF THE INVENTION

In recent years, demand for a further reduction in feature size and a higher integration degree have arisen for semiconductor elements, LSIs, and VLSIs, and accordingly an image forming (projection) optical system with a high resolution is required in a projection exposure apparatus. Therefore, the NA of the image forming optical system is increasing, while the depth of focus of the image forming optical system is decreasing.

In a projection exposure apparatus of this type, the focal position (image surface position) and magnification of its projection optical system change due to a change in atmospheric pressure of the projection optical system, a temperature increase caused by light beams irradiated on the projection optical system, a temperature increase caused by heat generated by the apparatus including the projection optical system, and the like. These changes in focal position and magnification must be corrected.

A correction method is described in, e.g., Japanese Patent Laid-Open No. 10-41226 ("Projection Optical Apparatus and Method of Adjusting Image Forming Characteristic"). In this reference, in order to correct a change in a projection optical system upon a temperature increase caused by irradiated light beams, a change in focal position of the projection optical system and a change in magnification of the projection optical system, which are caused by a temperature change, are calculated based on a model formula, and are corrected. The state of focus after correction is detected by a focus detection mechanism. If a good in-focus state is not obtained, further correction control is performed. Fluctuation in magnification is also corrected in the same manner as in correction of the change in focal position.

As described above, conventionally, in order to correct a change in a projection optical system upon a temperature increase caused by incoming light beams, a change in focal position of the projection optical system and a change in magnification of the projection optical system, which are caused by a temperature change, are calculated based on a model formula, and are corrected. The state of focus after correction is detected by a focus detection mechanism. If a good in-focus state is not obtained, further focal position correction control is performed.

If the magnification fluctuates, it is corrected by calculating a correction amount with a model formula in the same manner as in the correction of the change in focal position. The state of magnification after correction is detected by a magnification detection mechanism. If a good magnification is not obtained, further magnification correction control is performed.

When detecting the state of focus with the focus detection mechanism and the magnification with the magnification detection mechanism, it takes time to process the detection results, thereby degrading the throughput in the manufacture of semiconductor devices.

SUMMARY OF THE INVENTION

The present invention has been made in consideration of the problems of the prior art described above, and has as its object to improve the throughput in the manufacture of semiconductor chips, liquid crystal panels, and the like.

In order to achieve the above object, according to the present invention, there is provided an exposure apparatus for projecting a master pattern onto a substrate with a projection optical system, having detection means for obtaining fluctuation information of at least one optical characteristic of the projection optical system, first arithmetic operation means for obtaining an adjustment amount of at least one optical characteristic on the basis of the fluctuation information, and second arithmetic operation means for calculating fluctuation information of the other optical characteristics in accordance with the obtained fluctuation information. According to the present invention, there is also provided a device manufacturing apparatus characterized by comprising data acquiring means for acquiring fluctuation information of optical characteristics of a projection optical system in the apparatus, adjusting means for adjusting the optical characteristics of the projection optical system, and arithmetic operation means for calculating an adjustment amount, to be instructed to the adjusting means, on the basis of a change characteristic model formula of the optical characteristics and data obtained by the data acquiring means, the data acquiring means detecting at least a small part of not less than two types of fluctuation information, and the arithmetic operation means calculating the other fluctuation information from a detection result of the small part of fluctuation information.

In order to calculate the other fluctuation information, the arithmetic operation means may comprise data storage means for storing in the form of data a relationship between the small part of the fluctuation information and the other fluctuation information, and fluctuation information extracting means for extracting the other fluctuation information stored in advance from the data storage means on the basis of a detection result of the fluctuation information obtained by the data acquiring means. At least two types of fluctuation information include focus information and magnification information of the projection optical system. In this case, one of the focus information and fluctuation information may be detected, while the other one is obtained by an arithmetic operation or looking up in a table.

According to the present invention, when measuring fluctuation in optical characteristics and calibrating at least two types of fluctuation information calculated by using the model formula, only a small part of the fluctuation information is actually measured while the other fluctuation information is obtained by calculation on the basis of the actual measurement value or by looking up in a table. Thus, a time-consuming process such as measurement of a focal position or magnification can be omitted, so that the throughput in the device manufacture can be improved. In particular, if the fluctuation information is on, e.g., fluctuation in focal position and fluctuation in magnification that have a high correlation with each other, if one data is actually measured, the other data can be obtained at high precision by an arithmetic operation or by looking up in a table. Accordingly, correction, which is by no means inferior to correction performed by actually measuring the two pieces of data, can be performed.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENT

According to a preferred embodiment of the present invention, a change in focal position of the projection optical system and a change in magnification of the projection optical system, which are caused by a temperature change, are calculated based on a model formula, and are corrected. The state of focus after correction is detected by a focus detection mechanism. If a good in-focus state is not obtained, further correction control is performed.

To control fluctuation in magnification, the difference between a magnification correction amount obtained by a model formula and an actual detection magnification amount obtained by a magnification detection mechanism, with respect to the difference between a focus correction amount obtained by the model formula and an actual focus amount detected by the focus detection mechanism, is stored as data for each temperature change amount of the projection optical system. A corresponding magnification correction amount is extracted from a focus correction amount detected by the focus detection mechanism, and further magnification correction is performed.

With this method, a time required for magnification detection with the magnification detection mechanism can be omitted, so that the throughput in the manufacture of semiconductor devices can be improved. When this magnification control was compared with a case wherein further magnification correction was performed by detecting a magnification correction amount with actual measurement, no significant differences were observed in the precisions of the focal position and magnification.

[Embodiment]

The embodiment of the present invention will be described with reference to the accompanying drawings.

Figure 1:
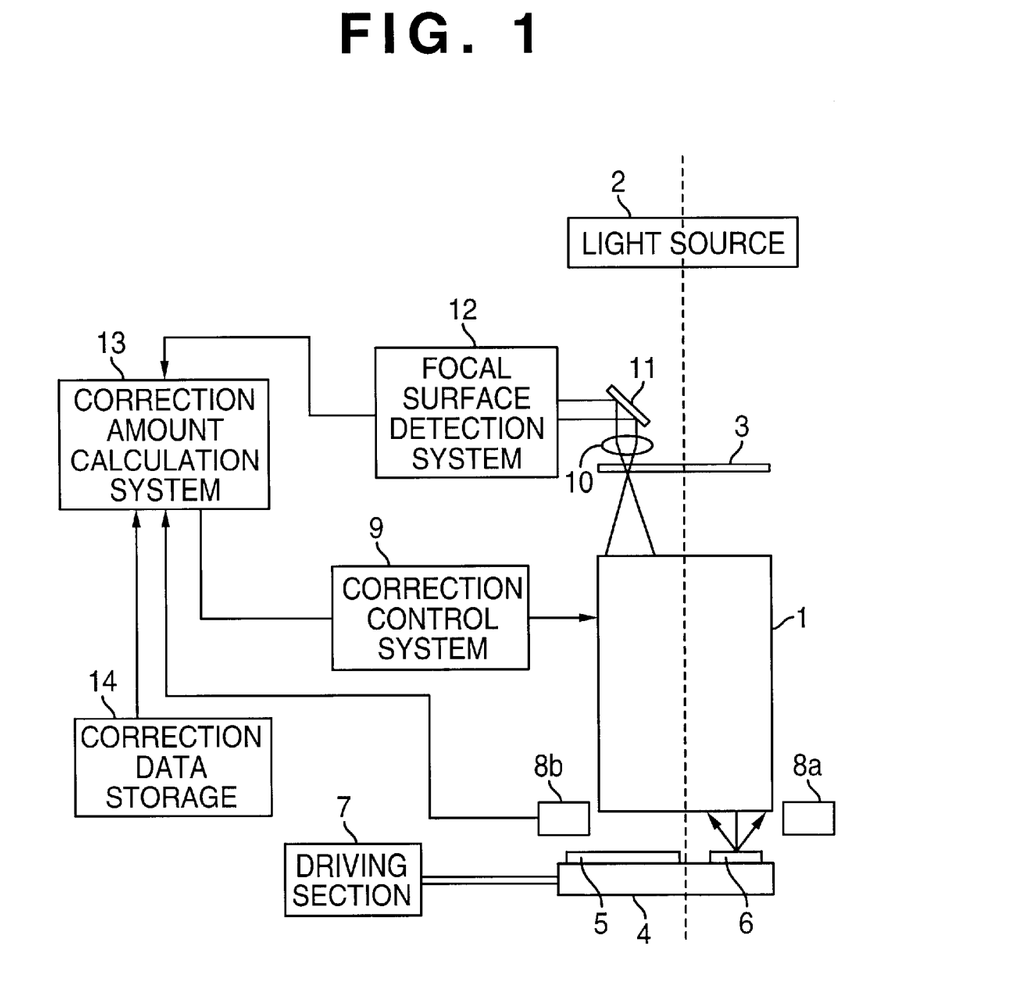
FIG. 1 is a schematic view of a semiconductor manufacturing apparatus according to the embodiment of the present invention.

FIG. 1 is a conceptual view showing the arrangement of a semiconductor manufacturing apparatus (reduction projection exposure apparatus) with an automatic focus control unit according to an embodiment of the present invention.

Referring to FIG. 1, reference numeral 3 denotes a reticle. A circuit pattern on the reticle 3 is reduced and projected onto a wafer 5 on a wafer stage 4 with a reduction projection lens 1 to form an image on the wafer 5, which is exposed in the pattern of the formed image. In FIG. 1, a reference mark 6 with a surface almost flush with the upper surface of the wafer 5 is arranged at a position adjacent to the wafer 5.

The wafer stage can be moved by a wafer stage driving section 7 in the direction of an optical axis (z) of the projection lens 1 and within a plane perpendicular to this direction, and can also naturally be rotated about the optical axis. The image surface region of the reticle 3 where the circuit pattern is to be transferred is illuminated by an illumination light source 2.

Referring to FIG. 1, reference numerals 8a and 8b make up a known off-axis auto focus optical system. Reference numeral 8a denotes a light-projecting optical system. A beam as non-exposure light emitted from the light-projecting optical system 8a is focused on that point on the reference mark 6 (or on the upper surface of the wafer 5), which intersects the optical axis of the projection lens 1. The beam reflected by the reference mark 6 becomes incident on the detection optical system 8b. Although not shown, a position detecting light-receiving element is arranged in the detection optical system 8b so as to be conjugate with the beam reflecting point on the reference mark 6. A positional shift of the reference mark 6 in the direction of the optical axis of the projection lens 1 is measured as a positional shift of the incident beam on the position detecting light-receiving element in the detection optical system 8b.

A correction amount calculation system 13 calculates predicted fluctuation amounts of the focal position and magnification of the projection lens as correction amounts by using a model formula using an exposure time, illuminance, exposure area, light transmittance of the reticle, and the like, and outputs the correction amounts to a correction control system 9.

A difference focus correction amount is calculated from the predicted focus fluctuation amount calculated with the model formula and focus information obtained from a focal surface detection system 12.

After that, a difference magnification correction amount corresponding to a difference focus correction amount experimentally obtained in advance is extracted from a correction data storage 14. Correction control of the focal position and magnification is instructed to the correction control system 9.

Magnification data can be experimentally obtained by observing an image actually formed on the wafer by exposure, or by forming a magnification measuring mark at a different position on the reticle 3, moving the reference mark 6 within the image-forming surface of the projection lens, and measuring the positions of the projection points of the two marks on the reticle 3.

Figure 2:
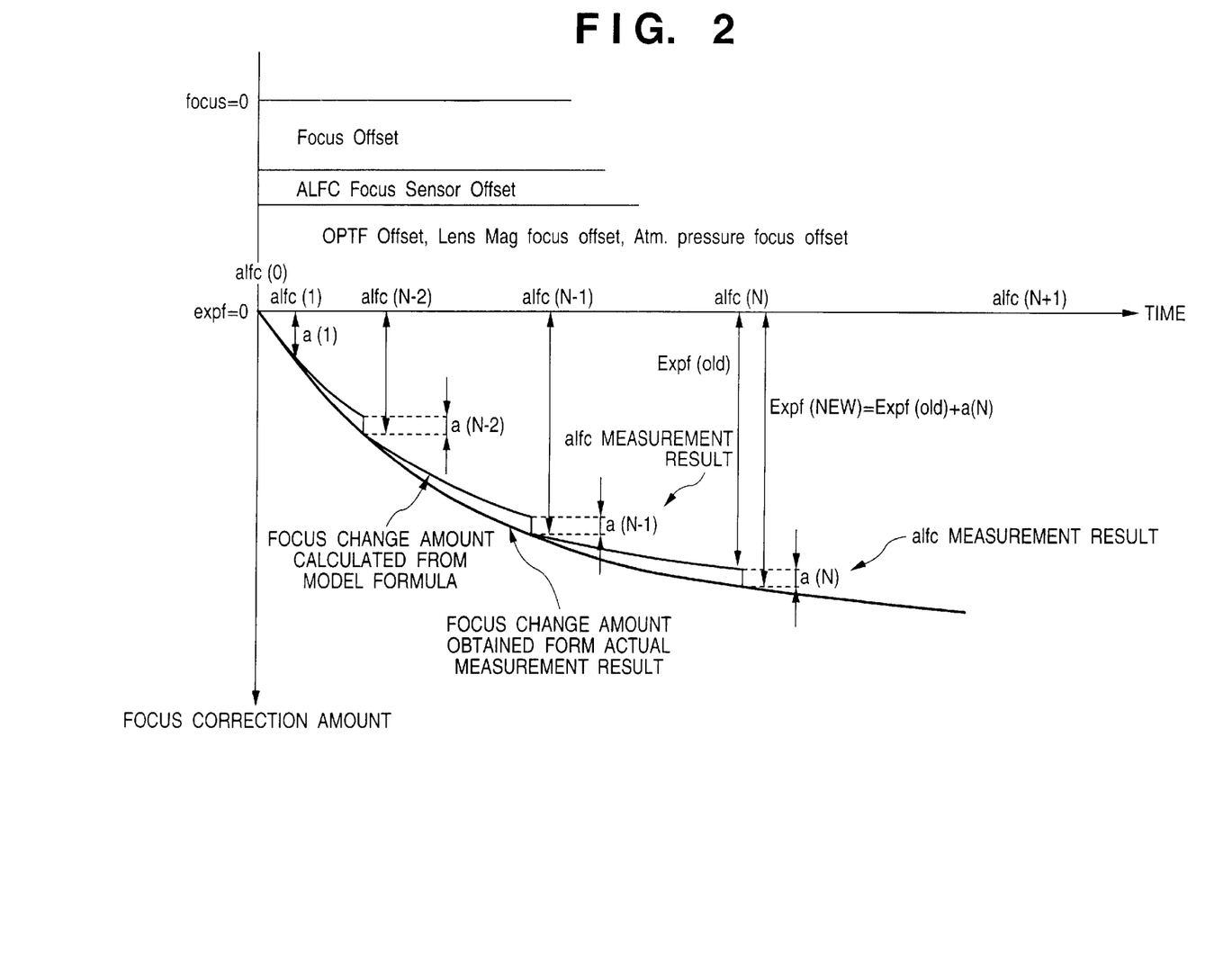
FIG. 2 is a graph showing a change model formula of a focus control amount upon a temperature change of a projection lens, and a shift of a difference focus correction amount serving as a change with respect to position information detected by a focal surface detection system.

FIG. 2 is a graph showing a change model formula of a focus control amount upon a temperature change of the projection lens, and a shift of the difference focus correction amount serving as the difference between a focus-zero point controlled by the model formula and a best focus position obtained by detecting, with the focal surface detection system 12, an image observed from the reference mark 6 through a projection lens 1, objective lens 10, and half mirror 11.

When the exposure amount is zero, the focus correction amount is calculated from the offset (Focus Offset) input in units of semiconductor manufacturing apparatuses, the mounting offset (ALFC Focus Sensor Offset) of the detection sensor, the mounting offset (OPTF offset) of the auto focus detection system 8b, a lens magnification focus offset (Lens Mag focus offset) calculated from the lens magnification, an atmospheric pressure offset (Atm. pressure focus offset) calculated from the atmospheric pressure, and the like. At this time point, the focus offset expf (0) caused by the lens temperature change is zero.

When exposure is started, the focus offset changes in accordance with the exposure amount of light radiated to the projection lens 1. For example, as a model formula for calculating the change amount of the focus offset, the following formula is used:

$$\text{expf}(t1) = K1 + (\text{expf}(t1-1) - K1) \times \exp(-t1 \times K2) \quad \text{(formula 1)}$$

where expf(t1): correction amount [nm]

expf(t1−1): previous correction amount [nm]

t1: exposure time [msec]

K1: arithmetic coefficient 1 (calculated from exposure time, illuminance, exposure area, light transmittance of the reticle, and the like)

K2: arithmetic coefficient 2

Usually, in a continuous wafer exposure process, detection with the focal surface detection system 12 is performed once while processing a plurality of wafers, i.e., once while processing twenty-five wafers.

The difference focus correction amount is the difference between the focus-zero point controlled by the model formula and the best focus position obtained by detecting, with the focal surface detection system 12, the image observed from the reference mark 6 through the projection lens 1, objective lens 10, and half mirror 11 corresponds to a (1) to a (N).

Concerning correction of the magnification, a change amount can be calculated by a model formula with the same principle.

Figure 3:
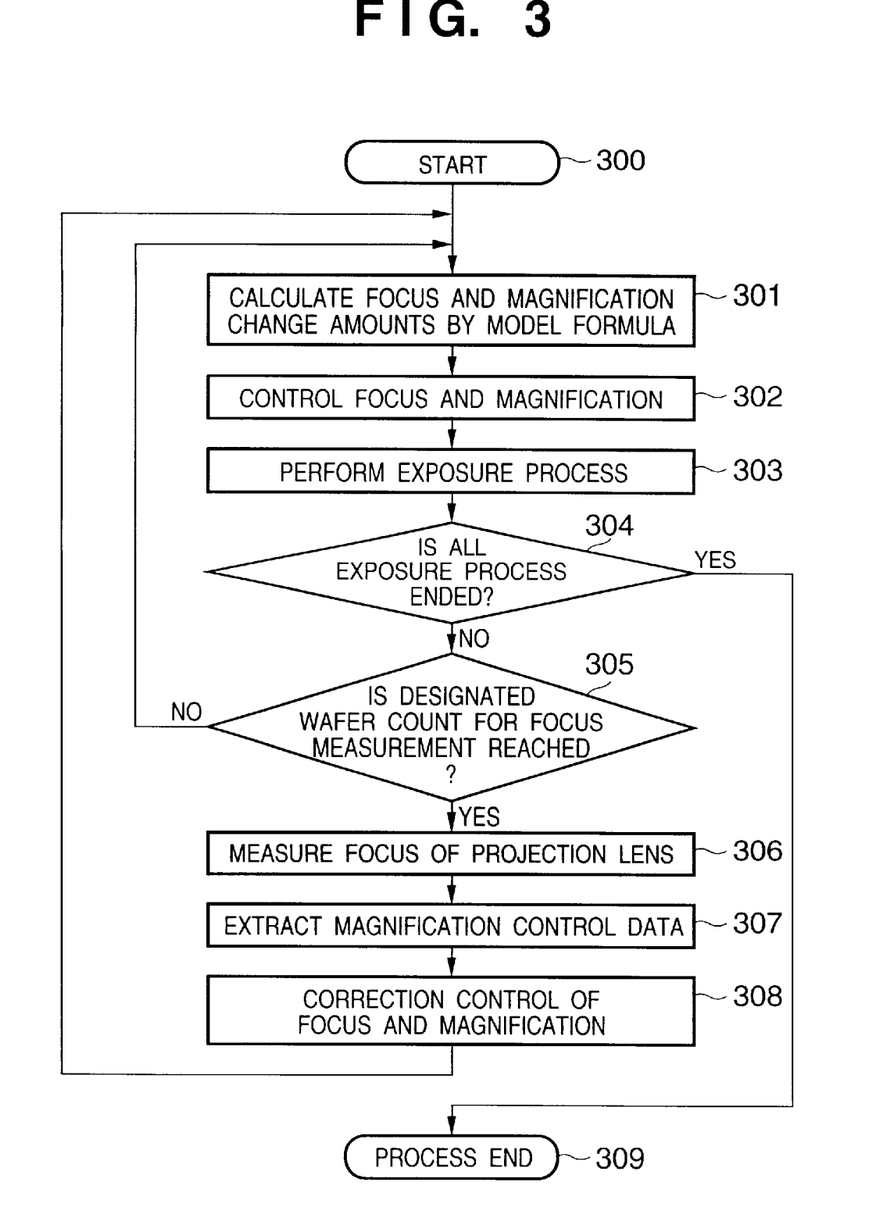
FIG. 3 is a flow chart showing a process started with a calculation of the change amount with the model formula and reaching actual correction control in an exposure process sequence.

FIG. 3 is a flow chart showing a process which starts with calculation of the change amount with the model formula and reaches actual correction control in an exposure process sequence.

In step S300, the control sequence is started.

In step S301, the correction amount calculation system 13 calculates the focus change amount and magnification change amount with the model formula, and transmits control amounts in consideration of the calculation results to the correction control system 9.

In step S302, the correction control system 9 controls the focus and magnification of the projection lens 1.

In step S303, the wafer stage 4 is driven to move the wafer 5 to an exposure position. The wafer 5 is irradiated with light from the illumination light source 2 with an appropriate exposure amount, so exposure is performed.

In step S304, a supervisory control computer (not shown) checks whether the exposure process is entirely ended. If Yes, the process is ended in step S309. If No in step S304, the flow advances to step S305.

In step S305, the supervisory control computer (not shown) checks whether a designated wafer count for focus measurement preset by the operator of the semiconductor manufacturing apparatus is reached. If Yes, the flow advances to step S306. If No in step S305, the flow advances to step S301.

In step S306, the wafer stage driving section 7 drives the wafer stage 4 where the reference mark 6 is placed in the direction of the optical axis of the projection lens 1 about the measurement zero point preset by the auto focus detection system 8b as the center, and the focal surface detection system 12 measures the difference between the zero point and the best focus position. The preset measurement zero point is the zero point calculated considering the focus change amount calculated with the model formula. The measurement value as the difference between the zero point and the best focus position corresponds to a (1), a(N−2), a(N−1), and a(N) in FIG. 2.

In step S307, the correction amount calculation system 13 extracts a difference magnification correction amount corresponding to a difference focus correction amount, experimentally obtained in advance, from the correction data storage 14.

In step S308, the correction amount calculation system 13 instructs the correction control system 9 to perform correction control of the focus and magnification on the basis of the difference focus correction amount measured in step S306 and the difference magnification correction amount extracted in step S307.

Figure 4:
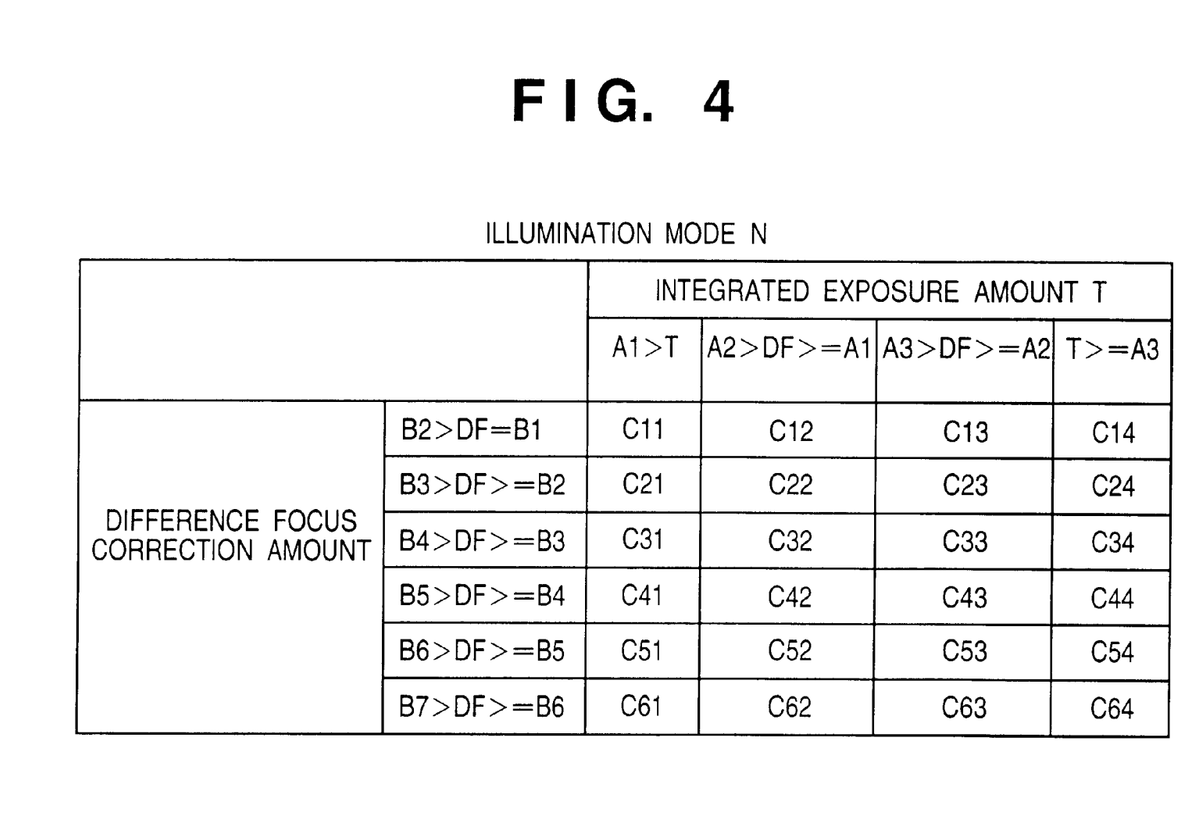
FIG. 4 is a correction data table held by a correction data storage.

FIG. 4 is a correction data table held by the correction data storage 14 in units of illumination modes.

This correction data table is a table of data which is experimentally obtained in advance on the relationship between an integrated exposure amount T of light irradiated on the projection lens 1 by the illumination light source 2, and a difference Cnm between a magnification calculated from the model formula and the actual magnification for a difference focus DF, which is the difference between the focus zero point calculated from the model formula and the best focus position measured by the focal surface detection system 12.

The integrated exposure amount T is determined in accordance with to what degree the illumination light source 2 irradiates energy on the lens, and is a value proportional to the lens temperature.

The correction amount of the lens magnification can be obtained not by a table method using the correction data table, but by using an extracted approximate function which may be extracted from experimental data in advance, and magnification control data may be obtained in step S307. With this method, the same effect as that obtained with the table method can be obtained.

$$\text{Lens Magnification Correction Amount } C = f(T, DF) \quad \text{formula 2}$$

As described above, according to this embodiment, a change in focal position of the projection optical system and a change in magnification of the projection optical system, which are caused by a temperature change, are calculated based on a model formula, and are corrected. The state of focus after correction is detected by a focus detection mechanism. If a good in-focus state is not obtained, further correction control is performed.

To control fluctuation in magnification, the difference between a focus correction amount obtained by the model formula and an actual detection focus amount obtained by the focus detection mechanism, and the difference between a magnification correction amount obtained by the model formula and an actual magnification amount detected by a magnification detection mechanism are stored as data for each temperature change amount of the projection optical system. A corresponding magnification correction amount is extracted from a focus correction amount detected by the focus detection mechanism, and further magnification correction is performed.

With this method, a time required for magnification detection with the magnification detection mechanism can be omitted, so that the throughput in the manufacture of semiconductor devices can be improved.

The above embodiment exemplifies a method of extracting magnification information from focus information. Alternatively, magnification may be measured and focus information may be extracted from magnification information. With this method as well, the throughput can similarly be improved.

Regarding correction parameters, they are not limited to the optical characteristics such as magnification and focus, but Seidel's five aberrations including distortion, astigmatism, coma, curvature of field, and spherical aberration can be corrected. For example, Seidel's five aberrations including distortion, astigmatism, coma, curvature of field, and spherical aberration can be corrected based on the results of magnification correction and focus correction, or on the fluctuation information detection results of other arbitrary parameters, by adjustment with a lens element moving means disclosed in Japanese Patent Laid-Open No. 10-054932 ("Projection Optical Apparatus and Projection Exposure Apparatus Mounted With the Device").

To calculate the aberration correction amount, a method of using a data table formed by experimentally obtaining in advance information on the difference between actually measured correction information and correction information which is non-measurement information, as described above, or a method of extracting an approximate function from experimental data and obtaining correction data by using the extracted function can be employed.

[Embodiment of Device Manufacturing Method]

An embodiment of a device manufacturing method utilizing the above exposure apparatus will be described.

Figure 5:
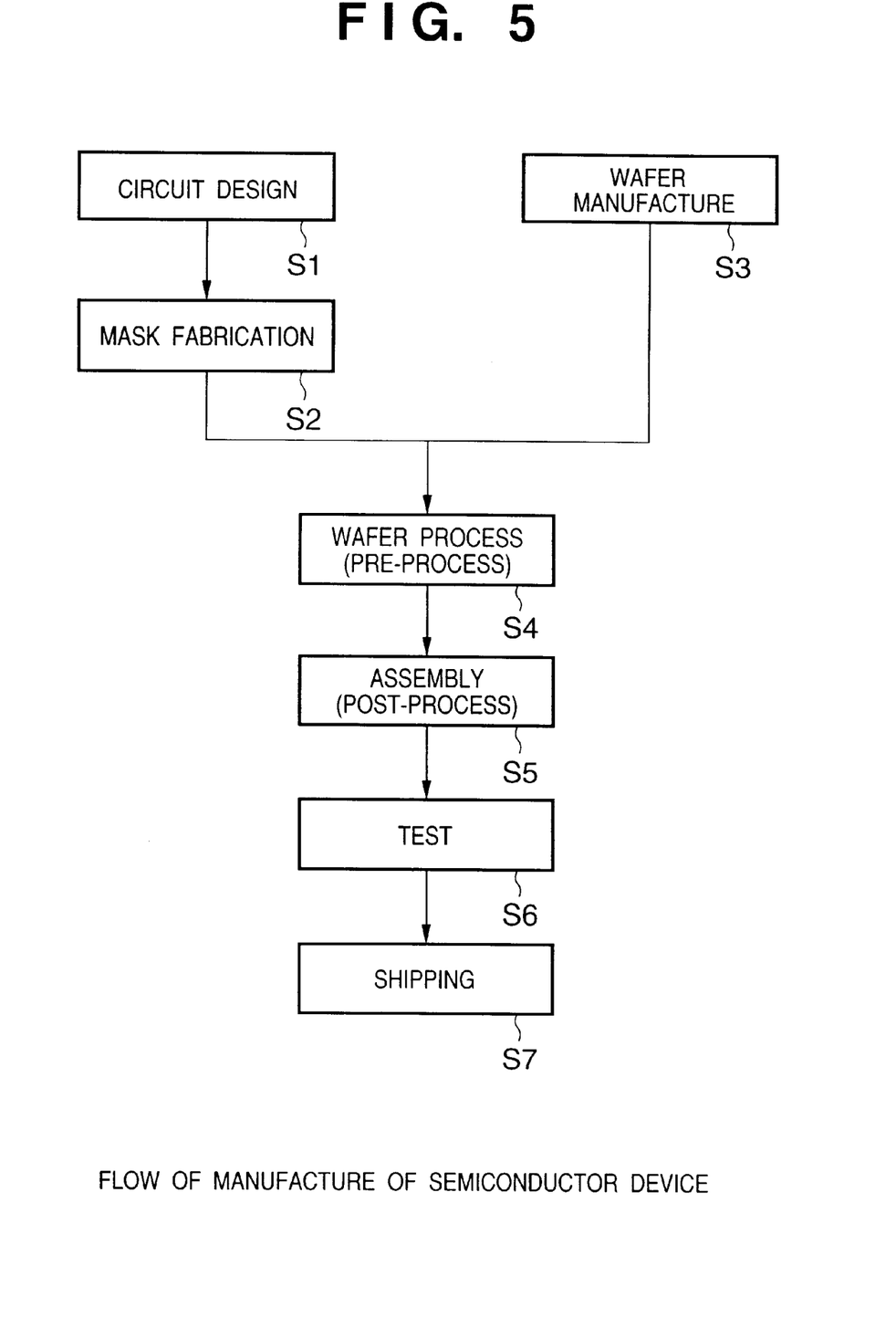
FIG. 5 is a flow chart showing the flow of the manufacture of a microdevice.

FIG. 5 is a flow chart of the manufacture of a microdevice (a semiconductor chip such as an IC or LSI, a liquid crystal panel, a CCD, a thin film magnetic head, a micromachine, or the like). In step 1 (circuit design), the pattern of the device is designed. In step 2 (mask formation), a mask on which the designed pattern is formed is formed. In step 3 (wafer manufacture), a wafer is manufactured by using a material such as silicon or glass. In step 4 (wafer process), which is referred to as a pre-process, the prepared mask and wafer are used to form an actual circuit on the wafer using a lithographic technique. In step 5 (assembly), which is referred to as a post-process, a semiconductor chip is formed by using the wafer manufactured in step 4. This process includes steps such as the assembly step (dicing and bonding) and the packaging step (chip encapsulation). In step 6 (test), tests such as an operation test and durability are performed with respect to the semiconductor device manufactured in step 5. The semiconductor device is completed through these steps and shipped (step 7).

Figure 6:
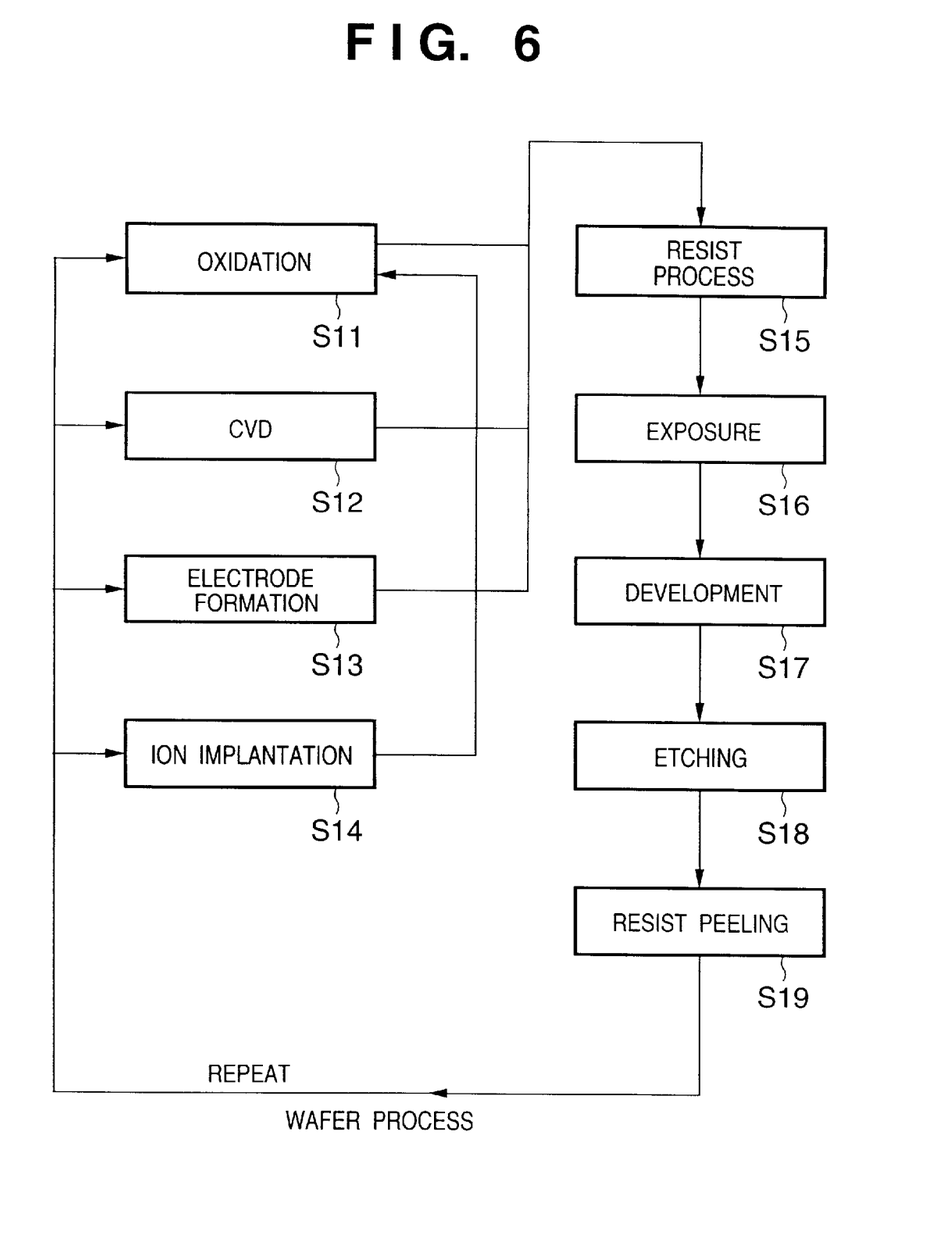
FIG. 6 is a flow chart showing a wafer process of FIG. 5 in detail.

FIG. 6 is a flow chart showing the above wafer process in detail. In step 11 (oxidation), the upper surface of the wafer is oxidized. In step 12 (CVD), an insulating film is formed on the upper surface of the wafer. In step 13 (electrode formation), an electrode is formed on the wafer by vapor deposition. In step 14 (ion implantation), ions are implanted into the wafer. In step 15 (resist process), the wafer is coated with a photosensitive agent. In step 16 (exposure), the circuit pattern on the mask is printed by exposure on the wafer by the exposure apparatus with the auto focus control unit described above. In step 17 (development), the exposed wafer is developed. In step 18 (etching), portions other than the developed resist image are removed. In step 19 (resist peeling), the unnecessary resist after etching is removed. By repeating these steps, multiple circuit patterns are formed on the wafer.

A high-integration device, which is difficult to manufacture in the prior art, can be manufactured at a low cost by using the manufacturing method of this embodiment.

As has been described above, according to the above embodiment, of fluctuations in optical characteristics of the projection optical system, a small part of the fluctuation information is measured, while the other fluctuation information is obtained by calculation on the basis of the measurement result, or by looking up in a table. Therefore, a time required when further measuring fluctuation information other than the small part of fluctuation information that has been measured can be omitted, and the throughput in the manufacture of semiconductor chips and the like can be improved.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus comprising:

a projection optical system for projecting a pattern onto a substrate;

a detector for detecting information relating to at least one of a plurality of optical characteristics of said projection optical system;

a processor for calculating first information relating to the at least one of the optical characteristics and second information relating to at least another one of the optical characteristics of said projection optical system, and then obtaining correction information relating to the at least another one of the optical characteristics on the basis of the first information and information detected by said detector;

a first controller for controlling a relationship between a projection pattern of said projection optical system and the substrate for the at least one of the optical characteristics by using the first information and the detected information; and a second controller for controlling a relationship between the projection pattern and the substrate for the at least another one of the optical characteristics by using the second information and the correction information.

2. The apparatus according to claim 1, wherein one of the (i) the at least one of the optical characteristics and (ii) the at least another one of the optical characteristics includes foucs information of said projection optical system, and the other includes magnification information of said projection optical system.

3. The apparatus according to claim 1, wherein said processor obtains the correction information in accordance with a cumulative exposure amount.

4. The apparatus according to claim 1, wherein said processor obtains the correction information using a predetermined table.

5. The apparatus according to claim 1, wherein said processor obtains the correction information using an approximation function.

6. The apparatus according to claim 1, wherein said detector performs a detection once during an exposure processing for a predetermined number of substrates.

7. The apparatus according to claim 1, wherein the plurality of optical characteristics of said projection optical system includes at least one of distortion, astigmatism, coma, curvature of field, and spherical aberration.

8. A device manufacturing method of manufacturing a device, said method comprising the steps of:

coating a substrate with a resist;

projecting, with a projection optical system, a pattern onto the substrate to draw a pattern on the substrate;

detecting, with a detector, information relating to at least one of a plurality of optical characteristics of the projection optical system;

calculating, with a processor, first information relating to the at least one of the optical characteristics and second information relating to at least another one of the optical characteristics and then obtaining correction information relating to at least another one of the optical characteristics on the basis of the first information and information detected by the detector;

controlling, with a first controller, a relationship between a projection pattern of the projection optical system and the substrate for the at least one of the optical characteristics by using the first information and the detected information;

controlling, with a second controller, a relationship between the projection pattern and the substrate for the at least another one of the optical characteristics by using the second information and the correction information; and developing the substrate.

* * * * *

UNITED STATES PATENT AND TRADEMARK OFFICE
CERTIFICATE OF CORRECTION

PATENT NO. : 6,519,024 B2
DATED : February 11, 2003
INVENTOR(S) : Shinichi Hirano It is certified that error appears in the above-identified patent and that said Letters Patent is hereby corrected as shown below:

Title page,
Item [56], References Cited, insert the following:
-- FOREIGN PATENT DOCUMENTS
2633028     4/25/1997     Japan
10-41226    2/13/1998    Japan --.

Drawings,
Sheet 2 of 6, FIG. 2, beneath the second lead line from the left, at the bottom of the curve, "OBTAINED FORM" should read -- OBTAINED FROM --.

Column 8,
Line 43, "foucs" should read -- focus --.

Signed and Sealed this

Fourteenth Day of October, 2003

JAMES E. ROGAN
*Director of the United States Patent and Trademark Office*